(12) United States Patent
Bakker et al.

(10) Patent No.: US 7,279,690 B2
(45) Date of Patent: Oct. 9, 2007

(54) LITHOGRAPHIC APPARATUS AND DEVICE MANUFACTURING METHOD

(75) Inventors: Levinus Pieter Bakker, Helmond (NL); Vadim Yevgenyevich Banine, Helmond (NL); Vladimir Vitalevitch Ivanov, Moscow (RU); Konstantin Nikolaevitch Koshelev, Troitsk (RU); Bastiaan Matthias Mertens, RK's-Gravenhage (NL); Johannes Hubertus Josephina Moors, Helmond (NL); Frank Jeroen Pieter Schuurmans, Valkenswaard (NL); Givi Georgievitch Zukavishvili, Troitsk (RU); Bastiaan Theodoor Wolschrijn, Abcoude (NL); Marc Hubertus Lorenz Van Der Velden, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 173 days.

(21) Appl. No.: 11/094,490

(22) Filed: Mar. 31, 2005

(65) Prior Publication Data

US 2006/0219950 A1    Oct. 5, 2006

(51) Int. Cl.
*H05H 3/00*    (2006.01)

(52) U.S. Cl. .............................. 250/492.2; 250/504 R; 204/192.2; 430/5; 427/596

(58) Field of Classification Search ................ None
See application file for complete search history.

(56) References Cited

U.S. PATENT DOCUMENTS

2006/0131515 A1 *   6/2006   Partlo et al. ............ 250/504 R

FOREIGN PATENT DOCUMENTS

| EP | 1 491 963 A2 | 12/2004 |
| EP | 1 491 963 A3 | 8/2005 |

* cited by examiner

*Primary Examiner*—Nikita Wells
*Assistant Examiner*—Zia R. Hashmi
(74) *Attorney, Agent, or Firm*—Pillsbury Winthrop Shaw Pittman LLP

(57) ABSTRACT

A lithographic apparatus is arranged to project a beam from a radiation source onto a substrate. The apparatus includes an optical element in a path of the beam, a gas inlet for introducing a gas into the path of the beam so that the gas will be ionized by the beam to create electric fields toward the optical element, and a gas source coupled to the gas inlet for supplying the gas. The gas has a threshold of kinetic energy for sputtering the optical element that is greater than the kinetic energy developed by ions of the gas in the electric fields.

37 Claims, 4 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

In order to ensure satisfactory operation of the photolithographic apparatus, high quality optical elements such as refractive and/or reflective lenses should be used. However, it has been found that operation of a photolithographic apparatus may have a damaging effect on the optical elements. This is particularly the case when EUV radiation is used for exposing substrates. At EUV radiation wavelengths, satisfactory transparent materials have not not been found. This implies that mainly reflective optical elements (mirrors) should be used and that open connections should be used between different parts of the photolithographic apparatus along the beam path. Use of open connections entails the risk that contaminants from the radiation source or the substrate may reach the optical elements, thereby reducing their optical quality. To prevent this, a gas flow is typically introduced into the path of the beam to drag away contaminant particles before they can reach the optical elements. In the prior art, a heavy gas like argon is typically used, because a heavy gas more effectively drags along particles. As another measure, the use of a foil trap has been described in European Patent Application No. 1 491 963.

However, the added gas flow itself may become a source of danger to the optical elements. When EUV is transmitted through this gas medium, the absorption of EUV light (or other ionizing light) ionizes the gas and a plasma is formed. Because of the higher mobility of electrons, the plasma potential tends to rise above the potential of walls and optical elements, and ions may be accelerated towards walls and optical elements, thereby giving rise to a sputtering effect.

SUMMARY

It is an aspect of the present invention to provide for measures that reduce sputtering due to gas that has been introduced in the path of the projection beam.

According to an aspect of the invention, there is provided a lithographic apparatus arranged to project a beam from a radiation source onto a substrate. The apparatus includes an optical element in a path of the beam, a gas inlet for introducing a gas into the path of the beam so that the gas will be ionized by the beam to create electric fields toward the optical element, and a gas source coupled to the gas inlet for supplying the gas. The gas has a threshold of kinetic energy for sputtering the optical element that is greater than the kinetic energy developed by ions of the gas in the electric fields.

According to another aspect of the invention, there is provided a lithographic apparatus arranged to project a beam from a radiation source onto a substrate. The apparatus includes an optical element in a path of the beam, a first gas supply for supplying a first gas, a second gas supply for supplying a second gas that is lighter that the first gas, a first gas inlet coupled to the first gas supply and arranged to introduce the first gas from the first gas supply into the path of the beam, and a second gas inlet coupled to the second gas supply and arranged to introduce the second gas into a part of the path of the beam between the optical element and a location where the first gas is introduced into the path of the beam.

According to an aspect of the invention, there is provided a lithographic apparatus arranged to project a pattern from a patterning device onto a substrate. The apparatus includes an optical element in a path of a beam of radiation between the patterning device and the substrate, and an electron source for supplying free electrons in a region adjacent an optically active surface of the optical element so that a plasma potential adjacent the active surface will be under a potential of the optical element.

According to an aspect of the invention, there is provided a lithographic apparatus arranged to project a pattern from a patterning device onto a substrate. The apparatus includes a radiation source comprising a cathode and anode. A hole is provided in the anode for passing radiation from a region between the anode and the cathode. The apparatus also includes a collector lens arranged to receive the radiation from said hole, and a foil trap located in a radiation path from the anode to the collector lens. The foil trap includes electrically conductive strips that are electrically isolated from the anode so that an electric potential of the strips is free to float relative to a potential of the anode.

According to an aspect of the invention there is provided a device manufacturing method in which sputtering is reduced.

According to an aspect of the invention, there is provided a device manufacturing method that includes patterning a beam of radiation with a patterning device, projecting the patterned beam of radiation onto a substrate, using an optical element in a path of the beam, and introducing gas into the path of the beam so that the gas will be ionized by the beam to create electric fields with field lines toward the optical element. The gas has a threshold of kinetic energy for sputtering the optical element that is greater than the kinetic energy developed by ions of the gas in the electric fields.

According to an aspect of the invention, there is provided a device manufacturing method the includes projecting a pattern from a patterning device onto a substrate with a beam of radiation, and providing a first gas in a path of the beam between a source of contaminants and an optical element in the path of the beam during projection of the pattern. The first gas includes one or more first gas species. The method also includes providing a second gas in the path of the beam between the first gas and the optical element during projection of the pattern. The second gas includes one or more second gas species that are lighter than the one or more first gas species.

According to an aspect of the invention, there is provided a device manufacturing method that includes projecting a pattern from a patterning device onto a substrate using a beam of radiation, and supplying free electrons in a region adjacent to an optically active surface of an optical element in the beam path with a free electron current so that a plasma potential adjacent the optically active service is lower than a surface potential of the optically active surface.

According to an aspect of the invention, there is provided a device manufacturing method that includes projecting a pattern from a patterning device onto a substrate with a beam of radiation, and trapping electrons from gas that is ionized by radiation from the beam with a mesh of fibers.

According to an aspect of the invention, there is provided a device manufacturing method that includes projecting a pattern from a patterning device onto a substrate with a beam of radiation, exciting radiation for use in the beam with a cathode-anode assembly, providing a foil trap interposed between the cathode-anode assembly and an initial collector lens in the beam path, and allowing an electrical potential of the foil trap to float relative to a potential of the anode.

BRIEF DESCRIPTION OF THE DRAWINGS

Embodiments of the invention will now be described, by way of example only, with reference to the accompanying schematic drawings, in which corresponding reference symbols indicate corresponding parts, and in which.

DETAILED DESCRIPTION

Figure 1:
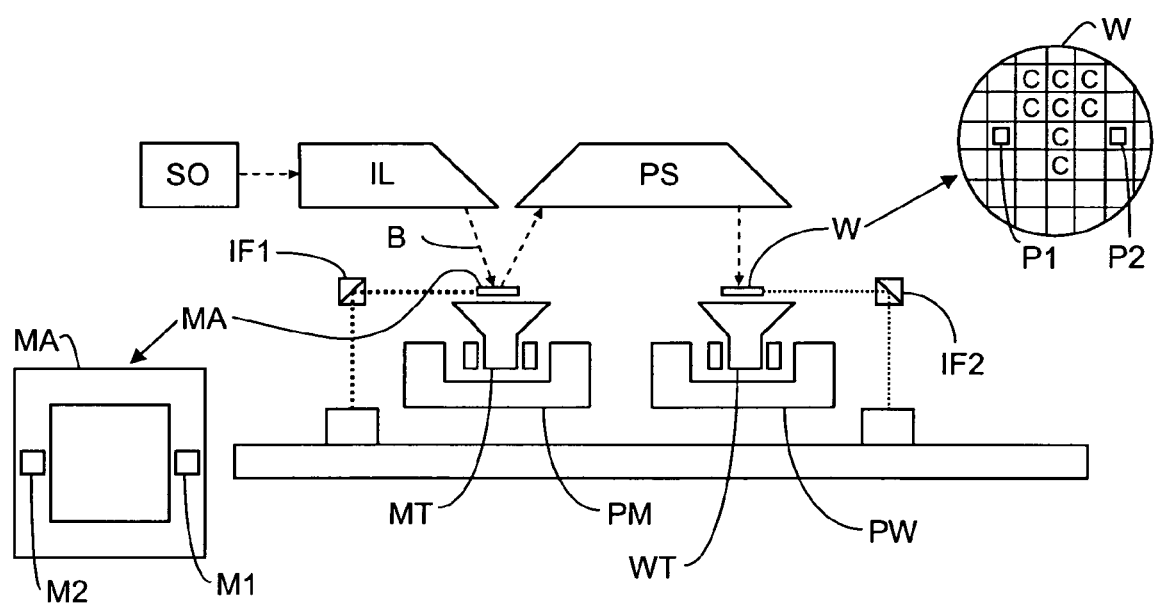
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable, as needed. The support structure may ensure that the patterning device is at a desired position, for example, with respect to the projection system PS. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section, such as to create a pattern in a target portion of the substrate. It should be noted that the pattern imparted to the radiation beam may not exactly correspond to the desired pattern in the target portion of the substrate, for example, if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate, for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases, the source may be an integral part of the lithographic apparatus, for example, when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally, a pulsed radiation source is employed and the programmable patterning device is updated as needed after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
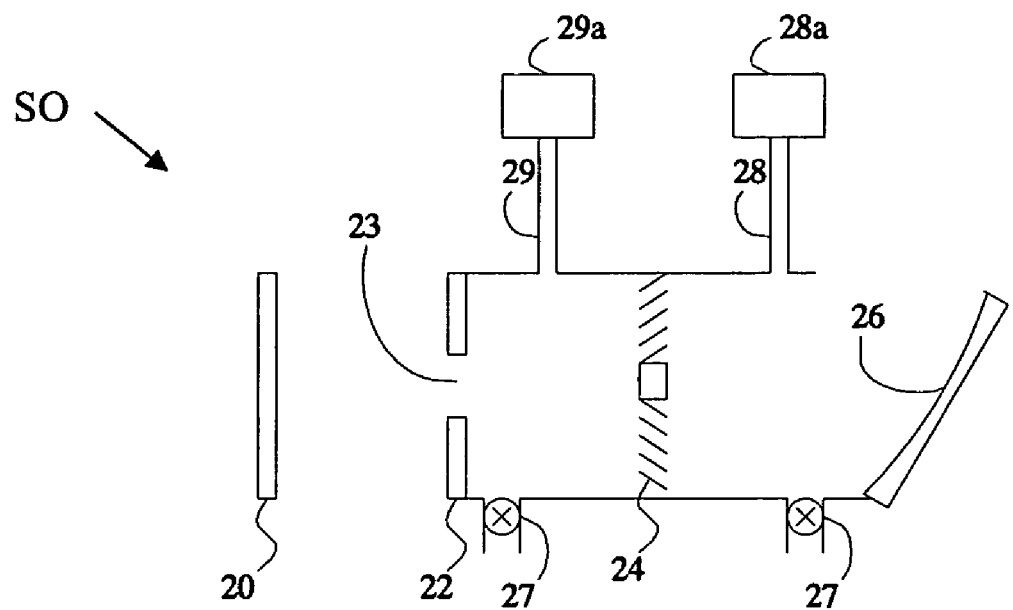
FIG. 2 schematically shows a radiation source of the apparatus of FIG. 1.

FIG. 2 schematically shows a plasma source embodiment of radiation source SO. In this embodiment, source SO contains a cathode 20, an anode 22, a foil trap 24 and a collector lens 26 (typically a reflective lens). In addition, a first and second gas supply source 28a, 29a, respectively, are shown that are coupled to gas inlets 28, 29, respectively, which debouches into the space between anode 22 and collector lens 26.

In operation, high-frequency, high-voltage pulses are applied between cathode 20 and anode 22. The applied voltage lowers the potential of cathode 20 relative to the potential of anode 22, thereby creating a pulsed electric field between anode 22 and cathode 20. Under the influence of the pulsed electric field, there is a current between the anode 22 and cathode 20 which results in increased ionization of gas (e.g. xenon, tin, . . . ) that is present between cathode 20 and anode 22. The ionized gas emits radiation, which passes through a hole 23 in anode 22 toward collector lens 26 that forms the front end of the illumination system (not shown). Typically, anode 22 is grounded (electrically connected to other parts of the apparatus that are not electrically active), so that normally no electric field occurs from anode 22 to the rest of the apparatus.

With this configuration, there may be a risk that particles that travel from the cathode/anode assembly may reach collector lens 26 and/or further optical elements of the apparatus. This may lead to deterioration of the quality of these optical elements and a need for replacement. Various precautions are usually taken to reduce the number of particles that will reach the optical elements. Preferably, a flush gas is introduced into the space between anode 22 and collector lens 26 to catch particles. A flow of the gas is maintained to drag along the particles. Secondly, the gas should have a stopping effect on the high energy particles (ions and atoms) that are emitted from the source. For efficient dragging, a heavy gas such as argon is conventionally used. However, it has been found that argon may lead to a sputtering problem at the optical elements, such as collector lens 26, because argon is ionized by the radiation of the projection beam and a plasma is formed. The plasma will create an electrical field because of the higher mobility of electrons, and in the boundary layer near optical elements, a potential drop is observed. In this potential drop, ions are accelerated towards the optical element, possibly resulting in sputtering.

In one embodiment of the invention this effect may be diminished, or even prevented, by using a light gas, such as helium (e.g $^4$He or $^3$He), hydrogen, or deuterium as a flush gas instead of argon. Sputtering is a threshold process. An ion that collides with a surface causes sputtering only when its kinetic energy is above a threshold value. The threshold will be lower as the mass of the ion is closer to the mass of the atoms in the optical element. The ions acquire kinetic energy under influence of the electric field (typically the field that is created by the absorption of the electrons, but fields due to charged electrodes may also contribute). The kinetic energy is substantially determined by the electric field strength. It has been found that in electric fields obtained in a lithographic apparatus, heavy ions, such as argon ions, may acquire sufficient kinetic energy to cause sputtering of the optical elements. However, for lighter gases, the threshold kinetic energy for sputtering is higher, because lighter ions tend to bounce back, thereby transferring little kinetic energy to the surface. It has been found that ions of certain lighter gases, that are sufficiently lighter than the atoms used in the optical elements, such as ions of lighter gases like hydrogen or helium (or isotopes thereof), do not acquire sufficient kinetic energy to cause sputtering in the electric fields obtained in a lithographic apparatus. Accordingly, substantially only a gas of a molecular species that has this property, or mixtures of substantially only gases that have this property are preferably used as flush gas.

Typically, the ions in the gas are lighter than a threshold weight that follows from the electric field strength near the optical elements that need to be protected against sputtering. At least hydrogen and helium and their isotopes have been found to have this property. Therefore, such light gases are preferred, even though such light gases are generally least suitable as flush gas because at equal pressure they are less efficient in dragging along particles than heavy gases such as argon. However, this can be compensated for by using light gas at a higher gas pressure. It has been found that the higher pressure does not increase the sputtering effect when the kinetic energy of the light gas remains below the high sputtering threshold for such a light gas.

In an embodiment, helium and/or hydrogen is introduced into a space between foil trap 24 and collector lens 26 by means of a helium and/or hydrogen gas supply source 28a that is coupled to a gas inlet 28 that debouches into the space between foil trap 24 and collector lens 26. In this embodiment, argon is introduced into and extracted from the space between anode 22 and foil trap 24 using an argon supply source 29a coupled to a further gas inlet 29 that debouches into the space between anode 22 and foil trap 24. In this way, the argon serves to drag along particles and to bring the particle stream in thermal equilibrium at a temperature defined by the argon. Helium and/or hydrogen counteract flow of argon toward collector lens 26. An experimental selection of the pressure and flow rate of the gases is made, so that damage to the optical elements is reduced to an acceptable level. For example, a pressure of about $10^{-3}$–$10$ mbar may be used for the helium and/or hydrogen and a pressure of about $10^{-3}$–$10^{-1}$ mbar may be used for argon, with a flow rate, i.e. gas load, of about 0.1–100 mbar liter per second. In a further embodiment, gas is introduced at the position of foil trap 24.

In an embodiment, helium and/or hydrogen is introduced into both the space between foil trap 24 and anode 22 and the space between foil trap 24 and collector lens 26, and gas is removed from these spaces to maintain a flow. Separate inlets for the same kind of gas that debouch into these spaces may be used, or only inlets that debouch into one of the spaces, preferably the space between foil trap 24 and collector lens 26. Similarly, one or more pumps 27 with inputs coupled to a single one or both of these spaces may be used to pump out gas, preferably at least from the space between foil trap 24 and anode 22. In this embodiment, the function to drag along particles is performed wholly or mainly by the light gas. The pressure and flow rate of the gas may be selected experimentally, so that damage to the optical elements is reduced to an acceptable level. In one example, a pressure of about $10^{-3}$–$10$ mbar may be used for the light gas in the space between foil trap 24 and anode 22, with a flow rate, i.e. gas load, of about 0.1–100 mbar liter per second.

Figure 3:
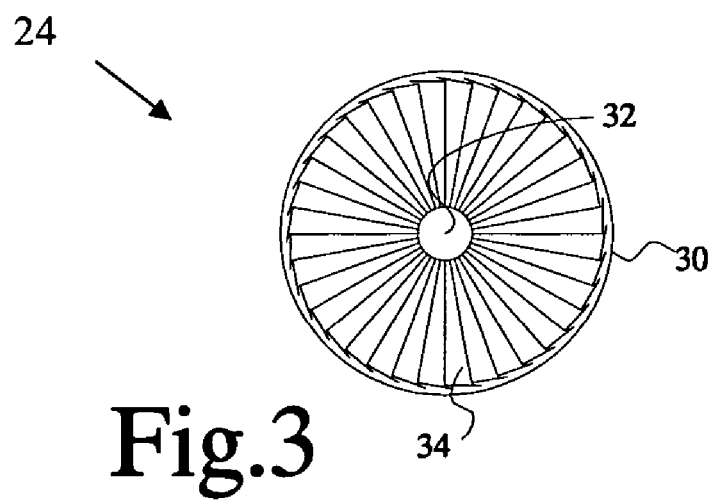
FIG. 3 shows a schematic front view of a foil trap of the radiation source of FIG. 2.

FIG. 3 shows a schematic front view of an embodiment of foil trap 24. Foil trap 24 is also provided to trap particles that travel through hole 23. Foil traps are known per se. Foil trap 24 of the embodiment includes a plurality of thin strips 30 that are arranged as Venetian blinds, at an angle of about forty five degrees to the axis from the center of hole 23 to the center of collector lens. Alternatively, the strips may be in parallel with that axis. Strips 30 are arranged as the spokes of a wheel from a central hub 32 to a rim portion 34. Strips 30 may be made of Molybdene, for example, with a thickness selected so that an appreciable amount of the radiation is passed. A thickness of about 0.2 mm may be used, for example. Strips 30 serve to trap and/or deflect particles that travel from hole 23. Strips 30 are electrically conductive. Conventionally, strips 30 are kept at the same potential as anode 22 by means of an electrically conductive connection between strips 30 and anode 22.

High frequency voltage pulses or oscillations with an amplitude in the kilovolt range have to be applied between cathode 20 and anode 22. In practice, it has been found that the application of such a high frequency-high amplitude voltage also leads to potential differences between anode 22 and other part of the apparatus, even if the anode is grounded by electrical conducting connections between anode 22 and the rest of the apparatus. In particular, it has been found that potential differences can arise between anode 22 and collector lens 26. These potential differences lead to an enhancement of the number density of free charge carriers and an acceleration of ions toward collector lens 26, which leads to sputtering damage.

It has been found that this problem may be solved by allowing the potential of the foil trap to float with respect to that of the cathode. In one embodiment, all structural connections that serve to hold foil trap 24 in place with respect to the remainder of the apparatus are electrically isolating, so that these connections do not define the potential of the foil trap 24 relative to the remainder of the apparatus. It has been found that in this case, the potential of the foil trap follows that of collector lens 26.

In this way, the electric field strength between foil trap 24 and collector lens 26 may be reduced, which reduces or eliminates damage due to sputtering. As an alternative, a construction may be used in which an electrically conductive mechanical support structure between foil trap 24 and the remainder of the apparatus is provided only from foil trap 24 in the direction of collector lens 26, for example, because this support structure is the only support structure of foil trap 24, or because other support structures are of electrically isolating material. Although this alternative may be viable, because the support structure should not be located in the direct path from foil trap 24 to collector lens 26, care should be taken that the support structure does not develop a voltage difference under influence of the pulsed electric voltages that are needed to create the field between anode 22 and cathode 20.

Another sputtering problem may occur due to flush gas that is introduced to reduce contamination of the optical elements due to particles that emanate from substrate W during projection of the pattern beam.

Figure 4:
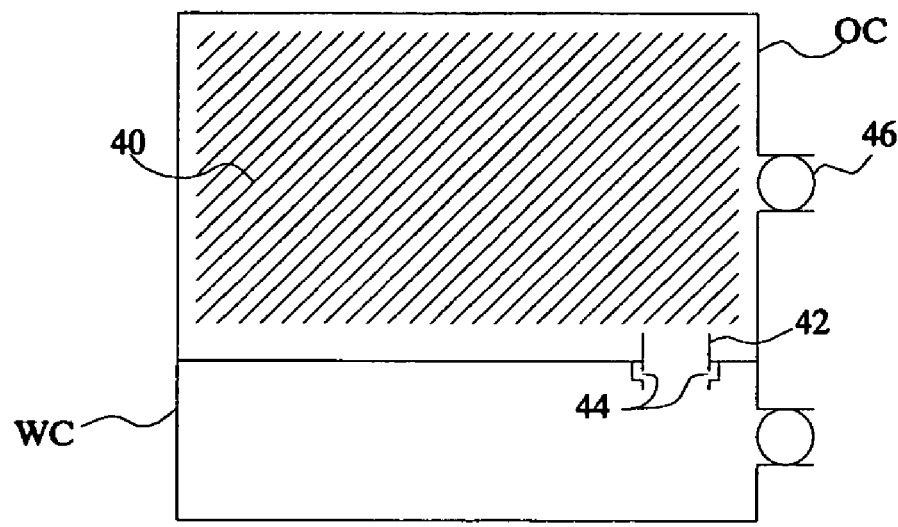
FIG. 4 shows a configuration for introducing flush gas to the apparatus of FIG. 1.

FIG. 4 shows a configuration for introducing flush gas between substrate W and a space for optical elements 40 of the projection system. Optical elements 40 typically include a plurality of mirrors with curved, i.e. optically active, surfaces for reflecting the beam. Since optical arrangements for projection systems are known per se, and their precise arrangement is not relevant for the invention, no individual elements are shown but a space where the optical elements are located is shown as a shaded region. The optical elements 40 are located in a walled optics compartment OC and substrate W is located in a walled substrate compartment WC. An open channel connection 42 connects the optics compartment OC and the substrate compartment WC. The open channel connection serves to pass the projection beam PB from the optics compartment OC to the substrate compartment WC and has a diameter that substantially corresponds to the width of beam PB, or the maximum width over which beam PB may be scanned.

In open channel connection 42, a gas lock is formed to reduce the risk that particles that emanate from substrate W reach optical elements 40. A gas inlet 44 is provided in or near channel connection 42 to introduce flush gas into channel connection 42. Pumps 46, 48 are coupled to optics compartment OC and substrate compartment WC to pump out flush gas, so that a flow is maintained from channel connection 42 to pumps 46, 48. The flush gas serves to catch and drag along particles that emanate from substrate W during projection of the projection beam PB onto substrate W. Typically, a heavy gas like argon is used as flush gas.

It has been found that such a flush gas can lead to damage due to sputtering or etching at the surface of the optical elements 40 in optics compartment OC. Argon is ionized by the radiation of the projection beam. The resulting electrons and ionized argon effectively are neutralized at the optical elements 40. The electrons travel much faster than argon ions and leave a plasma behind with a positive potential with respect to the walls and optical elements. Ions that impinge on the optical elements 40 may cause superficial damage that deteriorates their optical performance. As a result, the useful lifetime of the optical elements 40 may be reduced. According to the invention, any one or a combination of measures may be taken to reduce this effect. Furthermore, sputtering of structures in the optical compartments may lead to particles of structure material in the gas phase that can redeposit on the optical elements.

Figure 5:
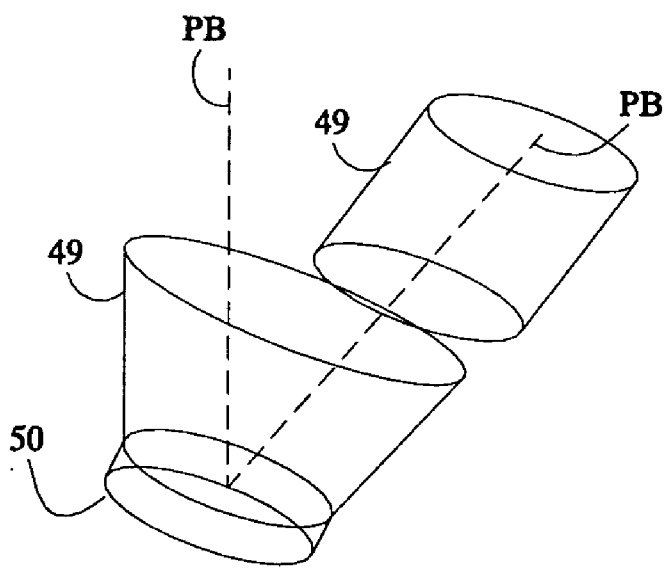
FIG. 5 shows an embodiment using a mesh of fibers in the apparatus of FIG. 1.

FIG. 5 shows an embodiment in which a mesh of fibers 49 is provided that substantially surrounds a path of the projection beam PB, as the path runs from one optical element 50 to another. One or more meshes may be used. Mesh 49 is located so that it does not cross the path of the beam. A mesh of fibers is used because it presents high surface area in proportion to volume. Electrons are trapped at the surface of the fibers. Because of the high surface area, a large fraction of the electrons may be trapped. As a result, a majority of the ions will be electrically attracted to mesh 49 where they will recombine, instead of at optical elements 50.

In an embodiment, the mesh even extends into the path of the beam. It has been found that when a mesh with sufficiently thin fibers is used (for example, with a diameter less that about 100 nanometer) loss of beam intensity remains acceptable. In an embodiment, a mesh of silicon fibers is used. Although a mesh that surrounds the path is preferably used, because this traps a maximum amount of the electrons that result from ionization due to the radiation in the beam, it should be understood that, without deviating from the invention, a mesh that does not fully surround the beam may be used. Also, although the mesh is preferably located substantially adjoining the path of the beam, because this traps a maximum amount of the electrons that result from ionization due to the radiation in the beam, it should be realized that without deviating from the invention the mesh may also be located at a greater distance.

In an embodiment, the electrical potential of the optical elements is raised relative to the plasma potential of the space that contains ionized flush gas. As a result, ions will be repelled from the mirror, which minimizes sputter damage. Various techniques may be used to raise the electrical potential of the optical elements relative to the space potential.

Several embodiments use the introduction of free electrons into the space near the optically active surface of the optical elements 40. In an embodiment, one or more thermionic electron sources (e.g. heated filaments) are provided near the optically active surface of the optical elements. A thermionic source introduces free electrons in the space near the optical elements, which lowers the plasma potential and attracts positively charged flush gas ions way from the optical elements.

In an embodiment, the photo electric effect is used to introduce additional electrons in the space. As is well known, the photo electric effect involves freeing of electrons from a solid under influence of radiation that impinges on the surface of the solid. Preferably, optical elements 40 themselves are used as solids for this purpose. To a certain extent, illumination of the optical elements by the projection beam already induces a photo electric effect that liberates electrons into the space near optical elements 40, which counteracts the attraction of ions by the optical elements 40. According to the invention, this effect may be increased, for example, by providing additional radiation that is not used to project the pattern onto substrate W, for the purpose of liberating electrons. An additional radiation source, capable of emitting light of sufficiently low wavelength to liberate electrons may be used, for example. The additional radiation may be provided, for example, at a different angle relative to the optical elements than the projection beam (typically along a direction that is closer to the normal to the optical surface of the optical elements than the projection beam).

In an embodiment, the projection beam is used for this purpose. By keeping the beam active at less than its maximum power level during an extended duration, an electron current from the optical elements can be maintained which lead to an increasingly positive potential of the optical elements relative to the plasma. In an embodiment, a beam power level of reduced intensity is intentionally used during exposure of a substrate and the duration of exposure is extended to achieve the same radiation dose in order to give photo-electrically generated electrons more time to diffuse from the optical elements, so that an electron current can be maintained. However, this requires a low intensity which may be impractically low under many circumstances.

In an embodiment, additional solid surfaces (other than the optical surfaces of the optical elements) are provided and illuminated to act as a source of electrons. In other embodiments, other electron sources may be used, such as cold cathodes (semi-conductor bodies that emit electrons under influence of an electric field in the semi-conductor body; such cold cathodes are known per se).

Figure 6:
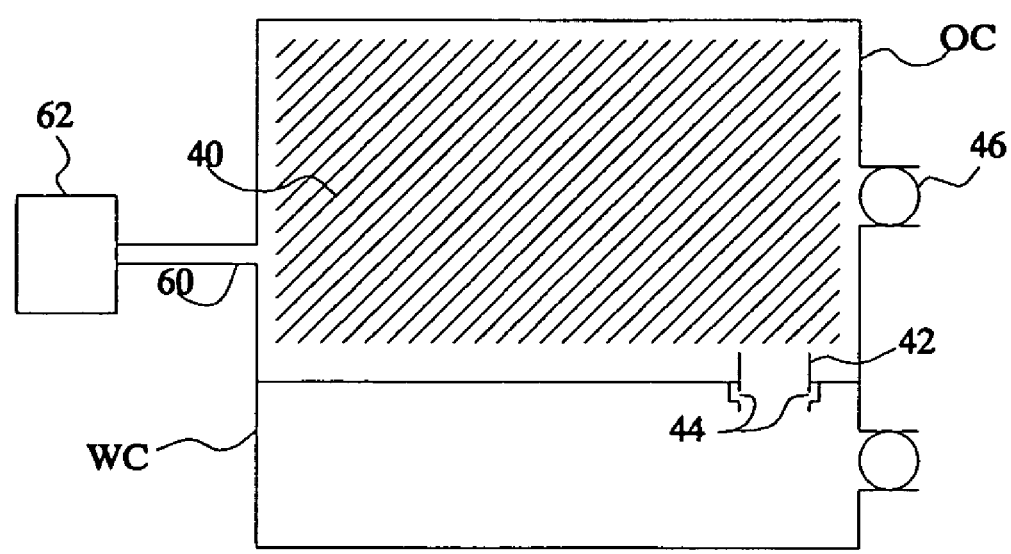
FIG. 6 shows embodiment in which a light gas is introduced to the apparatus of FIG. 1.

FIG. 6 shows an embodiment in which a light gas, such as helium or hydrogen, which is lighter than the flush gas from inlet 44, is introduced in the optical compartment OC. Preferably, a supply source 62 of light gas is coupled to an inlet 60 that is arranged so that the light gas is predominantly present in the region where optical elements 40 are located.

Light gas also undergoes ionization under influence of the projection beam. However, collisions of light gas ions, like hydrogen ions, with mirrors results in a smaller energy transfer. This leads to lesser sputtering and in particular cases to no sputtering at all, since sputtering is a process that occurs only if a threshold energy is exceeded. Furthermore, the higher mobility of hydrogen leads to a smaller potential drop over the plasma boundary layer, which further reduces sputtering effects.

Alternatively, the light gas may also be supplied mixed with heavier gas from inlet 44 in channels connection 42. In an embodiment, the heavy flush gas (e.g. argon) in channel connection 42 is replaced altogether with light gas such as helium or hydrogen. In principle, this may have the disadvantage that at the same flush gas pressure, particles from substrate W will be caught and dragged away less effectively than with a heavier gas. However, this effect may be compensated for by using a higher pressure of light gas, because light gas results in less damage to the optical elements 40. Because sputtering occurs only when ions have an energy above a threshold energy, the net result is that a smaller sputtering effect occurs or there is no sputtering effect at all. Furthermore, light gases like hydrogen absorb EUV less efficiently. As a result, for the same degree of debris suppression, the EUV absorption is about the same.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate as used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultra-violet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus arranged to project a beam from a radiation source onto a substrate, the apparatus comprising:
   an optical element in a path of the beam;
   a gas inlet for introducing a gas into the path of the beam so that the gas will be ionized by the beam to create electric fields toward the optical element; and
   a gas source coupled to the gas inlet for supplying the gas, wherein the gas has a threshold of kinetic energy for sputtering the optical element that is greater than the kinetic energy developed by ions of the gas in the electric fields.

2. A lithographic apparatus according to claim 1, wherein the gas comprises one or more gas species comprising helium and/or hydrogen and/or one or more isotopes thereof.

3. A lithographic apparatus according to claim 1, further comprising a plasma beam source, the gas inlet debouching in a space that comprises the beam path between the beam source and the optical element.

4. A lithographic apparatus according to claim 1, further comprising:
   a support table for supporting the substrate;
   a walled optics compartment that contains the optical element; and
   an open channel through a wall of the optics compartment for passing the beam from the optics compartment to the substrate,
   wherein the gas inlet debouches substantially in the channel.

5. A lithographic apparatus arranged to project a beam from a radiation source onto a substrate, the apparatus comprising:
   an optical element in a path of the beam;
   a first gas supply for supplying a first gas;
   a second gas supply for supplying a second gas that is lighter that the first gas;
   a first gas inlet coupled to the first gas supply and arranged to introduce the first gas from the first gas supply into the path of the beam; and
   a second gas inlet coupled to the second gas supply and arranged to introduce the second gas into a part of the path of the beam between the optical element and a location where the first gas is introduced into the path of the beam.

6. A lithographic apparatus according to claim 5, further comprising:
   a beam source; and
   a foil trap disposed between the beam source and the optical element,
   wherein the first gas inlet debouches in a first space between the beam source and the foil trap, and the second gas inlet debouches in a second space between the foil trap and the optical element.

7. A lithographic apparatus according to claim 6, further comprising a pump with an input coupled to the first space.

8. A lithographic apparatus according to claim 5, further comprising:
   a support table for supporting the substrate;
   a walled optics compartment that contains the optical element; and
   an open channel through a wall of the optics compartment for passing the beam from the optics compartment to the substrate,
   wherein the first gas inlet debouches substantially in the channel, and the second gas inlet debouches in the optics compartment at a location closer to the optical element than the channel.

9. A lithographic apparatus according to claim 5, wherein the first gas and the second gas being ionized by the beam create electric fields with field lines toward the optical element, the second gas having a threshold of kinetic energy for sputtering the optical element that is greater than the kinetic energy developed by ions of the second gas in the electric fields.

10. A lithographic apparatus according to claim 5, wherein the second gas comprises helium and/or hydrogen and/or one or more isotopes thereof.

11. A lithographic apparatus according to claim 5, wherein the first gas comprises argon.

12. A lithographic apparatus arranged to project a pattern from a patterning device onto a substrate, the apparatus comprising:
   an optical element in a path of a beam of radiation between the patterning device and the substrate; and
   an electron source for supplying free electrons in a region adjacent an optically active surface of the optical element so that a plasma potential adjacent the active surface will be under a potential of the optical element.

13. A lithographic apparatus according to claim 12, wherein the electron source is a thermionic electron source.

14. A lithographic apparatus according to claim 12, wherein the electron source comprises a radiation source directed at a solid surface and arranged to produce radiation to liberate electrons from the solid surface by means of a photo electric effect.

15. A lithographic apparatus according to claim 14, wherein the solid surface is a surface of the optical element that reflects the patterned beam of radiation.

16. A lithographic apparatus arranged to project a pattern from a patterning device onto a substrate, the apparatus comprising a mesh of fibers located in or adjacent to a path of the beam.

17. A lithographic apparatus according to claim 16, wherein the mesh substantially surrounds at least a section of a path of the beam, and substantially adjoins a region through which the beam travels, without extending into a path of the beam.

18. A lithographic apparatus according to claim 16, wherein at least part of the mesh extends into a path of the beam, said part containing fibers with a diameter of less than or equal to about 100 nanometers.

19. A lithographic apparatus according to claim 16, wherein the mesh is located adjacent a surface of an optical element in the beam path.

20. A lithographic apparatus arranged to project a pattern from a patterning device onto a substrate, the apparatus comprising:
   a radiation source comprising a cathode and anode, a hole being provided in the anode for passing radiation from a region between the anode and the cathode;
   a collector lens arranged to receive the radiation from said hole; and
   a foil trap located in a radiation path from the anode to the collector lens, the foil trap comprising electrically conductive strips that are electrically isolated from the anode so that an electric potential of the strips is free to float relative to a potential of the anode.

21. A device manufacturing method comprising:
   patterning a beam of radiation with a patterning device;
   projecting the patterned beam of radiation onto a substrate;
   using an optical element in a path of the beam; and
   introducing gas into the path of the beam so that the gas will be ionized by the beam to create electric fields with field lines toward the optical element,
   wherein the gas has a threshold of kinetic energy for sputtering the optical element that is greater than the kinetic energy developed by ions of the gas in the electric fields.

22. A device manufacturing method according to claim 21, wherein the gas comprises one or more gas species comprising helium and/or hydrogen and/or one or more isotopes thereof.

23. A device manufacturing method according to claim 21, wherein the gas is introduced into the beam path between a plasma beam source and the optical element.

24. A device manufacturing method according to claim 21, wherein the gas is introduced into the beam path in a channel for the beam path between a walled optics compartment that contains the optical element and a substrate compartment that contains the substrate.

25. A device manufacturing method comprising:
   projecting a pattern from a patterning device onto a substrate with a beam of radiation;
   providing a first gas in a path of the beam between a source of contaminants and an optical element in the path of the beam during projection of the pattern, the first gas comprising one or more first gas species;
   providing a second gas in the path of the beam between the first gas and the optical element during projection of the pattern, the second gas comprising one or more second gas species that are lighter than the one or more first gas species.

26. A method according to claim 25, wherein the first gas is supplied from a first inlet into a first space between a beam source and a foil trap that is located between the beam source and the optical element, and wherein the second gas is supplied from a second inlet into a second space between the foil trap and the optical element.

27. A method according to claim 26, further comprising pumping gas from the first space.

28. A method according to claim 25, wherein the first gas is introduced substantially from a beam passing channel between a compartment for the substrate and a walled optics compartment that contains the optical element, and the second gas is introduced through an inlet in the optics compartment.

29. A method according to claim 25, wherein the first gas and the second gas are ionized by the beam, resulting in the development of electric fields with field lines toward the optical element, and wherein the second gas has a threshold of kinetic energy for sputtering the optical element that is greater than the kinetic energy developed by ions of the second gas in the electric fields.

30. A method according to claim 29, wherein the second gas comprises helium and/or hydrogen and/or one or more isotopes thereof.

31. A device manufacturing method comprising:
projecting a pattern from a patterning device onto a substrate using a beam of radiation; and
supplying free electrons in a region adjacent to an optically active surface of an optical element in the beam path with a free electron current so that a plasma potential adjacent the optically active surface is lower than a surface potential of the optically active surface.

32. A method according to claim 31, wherein the free electrons are supplied from a thermionic electron source.

33. A method according to claim 31, wherein radiation other than along the beam path is supplied to a solid surface so that a photo electric effect is created at the solid surface and frees the electrons.

34. A method according to claim 33, wherein the solid surface is the optically active surface.

35. A device manufacturing method comprising:
projecting a pattern from a patterning device onto a substrate with a beam of radiation; and
trapping electrons from gas that is ionized by radiation from the beam with a mesh of fibers.

36. A method according to claim 35, wherein the mesh substantially surrounds at least a section of a path of the beam, and substantially adjoins a region through which the beam travels, without extending into the region.

37. A device manufacturing method comprising:
projecting a pattern from a patterning device onto a substrate with a beam of radiation;
exciting radiation for use in the beam with a cathode-anode assembly;
providing a foil trap interposed between the cathode-anode assembly and an initial collector lens in the beam path; and
allowing an electrical potential of the foil trap to float relative to a potential of the anode.

* * * * *